(12) United States Patent
Li et al.

(10) Patent No.: US 11,626,312 B2
(45) Date of Patent: Apr. 11, 2023

(54) METAL SPRING ANCHOR FOR ADVANCED PACKAGING

(71) Applicants: Dong Li, San Ramon, CA (US); Ge Yi, San Ramon, CA (US)

(72) Inventors: Dong Li, San Ramon, CA (US); Ge Yi, San Ramon, CA (US)

( * ) Notice: Subject to any disclaimer, the term of this patent is extended or adjusted under 35 U.S.C. 154(b) by 470 days.

(21) Appl. No.: 16/987,240

(22) Filed: Aug. 6, 2020

(65) Prior Publication Data
US 2022/0044955 A1    Feb. 10, 2022

(51) Int. Cl.
| | | |
|---|---|---|
| H01L 21/687 | (2006.01) | |
| H01L 21/68 | (2006.01) | |
| H01L 21/673 | (2006.01) | |
| H01L 21/67 | (2006.01) | |

(52) U.S. Cl.
CPC .. *H01L 21/68721* (2013.01); *H01L 21/67333* (2013.01); *H01L 21/68* (2013.01); *H01L 21/68757* (2013.01); *H01L 21/68785* (2013.01); *H01L 21/6715* (2013.01)

(58) Field of Classification Search
CPC ............... H01L 21/67; H01L 21/67144; H01L 21/6715; H01L 21/68785; H01L 21/68714; H01L 21/68757; H01L 21/68; H01L 21/67333; H01L 21/68728; H01L 21/68721
USPC ......... 206/453–456, 706–708, 710–712, 722
See application file for complete search history.

(56) References Cited

U.S. PATENT DOCUMENTS

| | | | | |
|---|---|---|---|---|
| 5,927,503 A * | 7/1999 | Nevill | ............... | H01L 21/67333 257/730 |
| 7,850,009 B2 * | 12/2010 | Wu | ............... | H01L 21/67386 206/454 |
| 8,302,313 B2 * | 11/2012 | Lin | ............... | G02F 1/133308 248/346.06 |
| 10,670,976 B2 * | 6/2020 | Hsueh | ............... | G03F 7/70741 |
| 2012/0043253 A1 * | 2/2012 | Jeong | ............... | H01L 21/67333 206/710 |
| 2013/0032508 A1 * | 2/2013 | Azuma | ............... | H01L 21/67333 206/710 |
| 2015/0114878 A1 * | 4/2015 | Lo | ............... | B65D 1/36 206/710 |
| 2015/0122698 A1 * | 5/2015 | Lo | ............... | H01L 21/67769 206/710 |

(Continued)

*Primary Examiner* — Rafael A Ortiz

(57) ABSTRACT

An Fan-out packaging system, comprising dedicated frame with associated movable metallic spring feature(s) for incoming known-good-die (KGD), is invented. The movable spring anchor(s) along with the boundaries of the frame locks the KGD in its designated position during EMC implementation and subsequent processes. In this system/approach, the position accuracy of KGDs during the wafer reconstitution process will be mostly dominated by the dicing accuracy. The proposed system is a very low cost approach as it does not need the expensive software/tool set and does not have a low throughput site-to-site lithography correction during exposure after metrology is carried out for every flash field. This system is particularly useful for chiplet consisting of component chips from different technologies and from substrate made of different material. The frames can be further used as part of function component for the packaged system either as electromagnetic shield, or heat dissipation/heat sink, or even RF antenna as well as other passive devices or active components.

12 Claims, 9 Drawing Sheets

(56) References Cited

U.S. PATENT DOCUMENTS

2015/0266607 A1* 9/2015 Lo .......................... B65D 73/02
 206/710
2016/0086834 A1* 3/2016 Kim .................. H01L 21/67333
 206/710

* cited by examiner

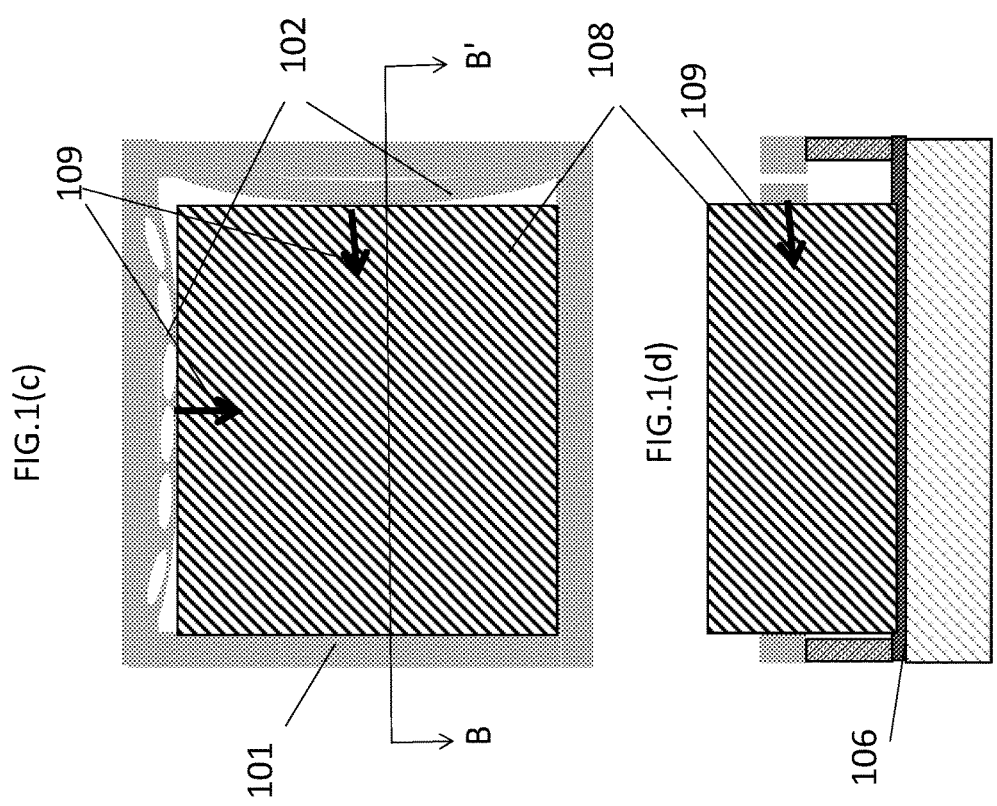
FIG.1(c)
FIG.1(d)
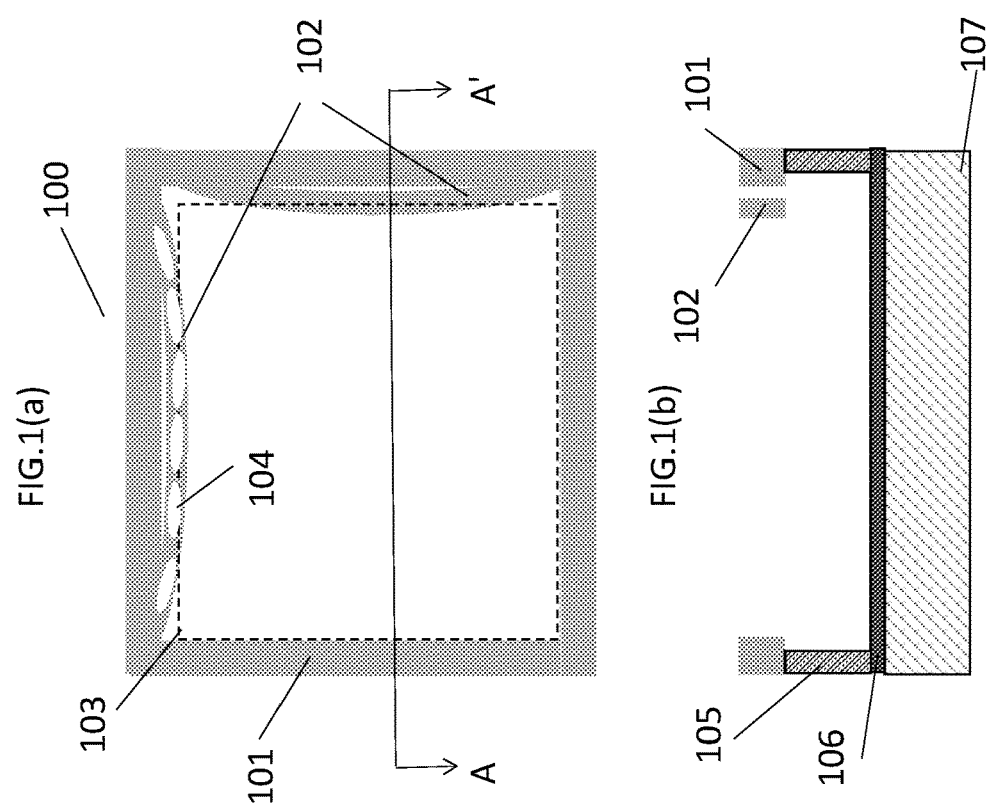
FIG.1(a)
FIG.1(b)

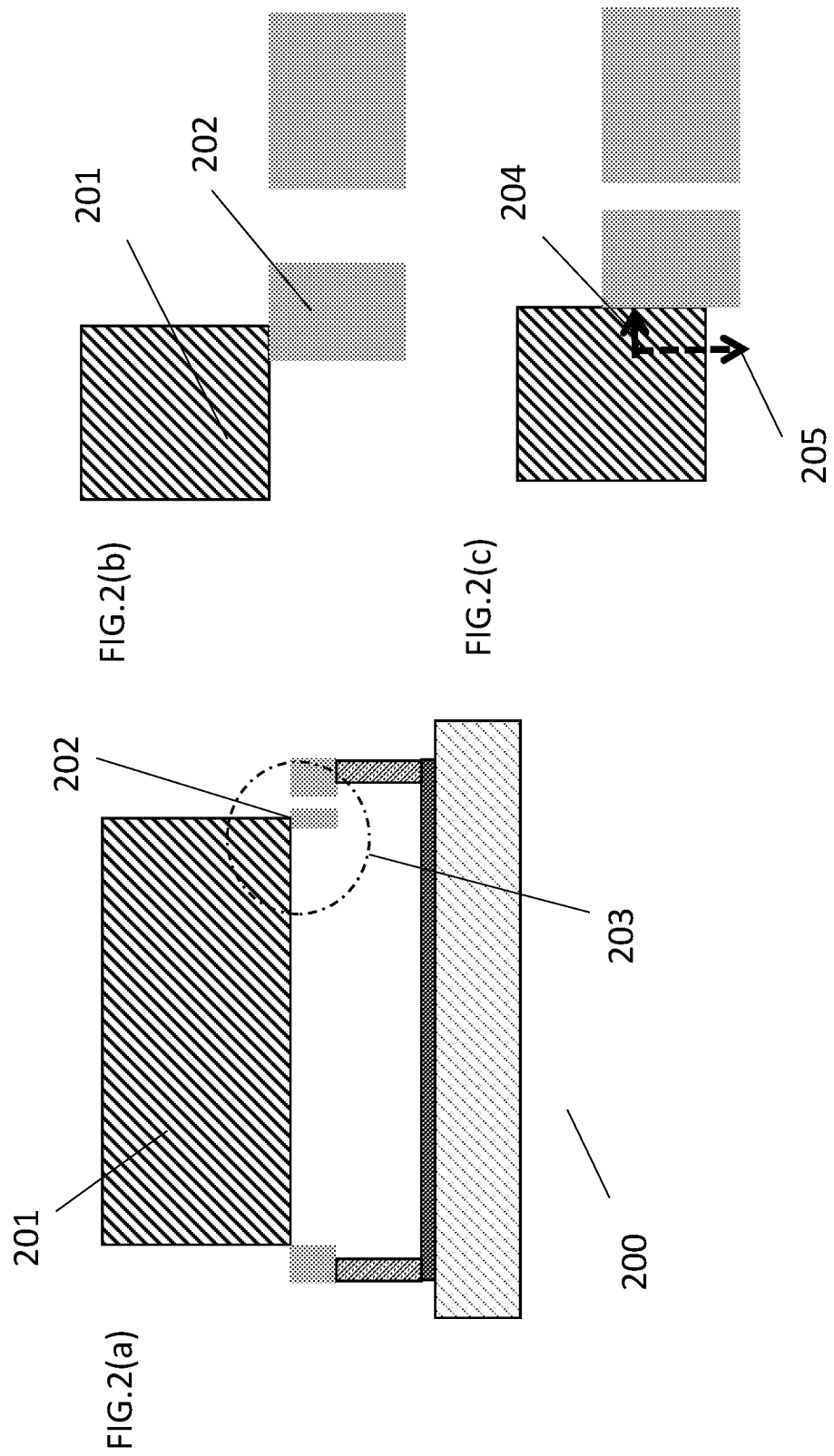

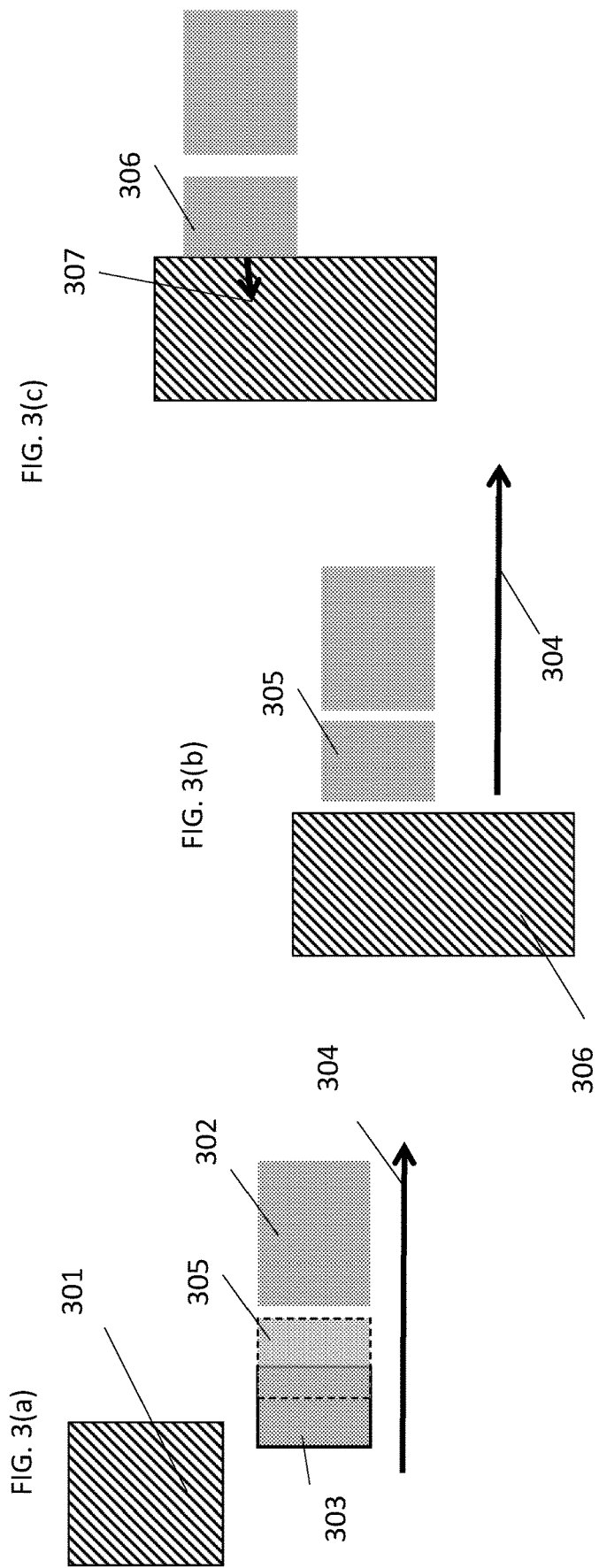

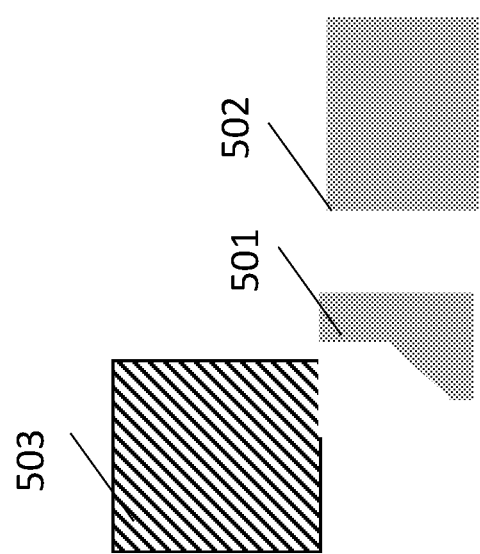
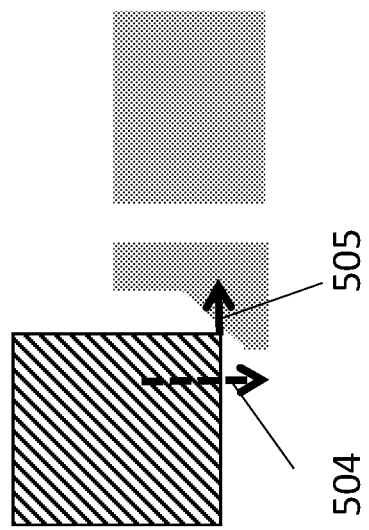
FIG. 5(a)
FIG. 5(b)

METAL SPRING ANCHOR FOR ADVANCED PACKAGING

RELATED U.S. APPLICATION DATA

Provisional application No. 62/972,739, filed on Feb. 11, 2020.

FIELD OF INVENTION

The invention is related to advanced packaging, particularly, fan-out panel-level package (FOPLP) or fan-out wafer level package (FOWLP).

BACKGROUND ART

Advanced packaging demands low cost, high performance and improved reliability. It is widely believed that FOPLP and FOWLP just can meet these requirements. The two fan out technologies provides space for redistributed I/O connections as well as flexibility, which is particularly important for homogeneous and heterogeneous integration such as chiplet.

Both FOPLP and FOWLP needs reconstitution process, in which dies are placed onto their designated grid locations either on a panel (for FOPLP) or on a wafer (for FOWLP). However, displacement up to 50 um from the nominal location of die can happen during reconstitution in the epoxy molding compound process or even sometimes during subsequent process steps. This displacement must get corrected otherwise it would cause a huge yield penalty.

Apart from displacement during epoxy molding, the die placement error during pick and place process, which can be exacerbated during molding process, also play a big part.

The existing approach for the displacement correction for high packaging yield is to conduct site-by-site correction at lithography process step after each site's displacement is characterized by metrology measurement as the global alignment correction can not rectify nonlinear die placement errors. However, carrying out site-by-site metrology and alignment correction at lithography exposure on a stepper is a sequential process, which has a low throughput and high cost. A improved approach is to use dedicated metrology equipment to capture die displacement then feed the information forward to optimize the stepper, This improved method does increase stepper throughput, reduce cost and increase productivity but does involve large capital cost on dedicated metrology tools and associated software.

It would be great beneficent and attractive if there is a mechanism to anchor the die in its targeted location during pick and place process as well as during epoxy molding process. This mechanism should be also complimentary to existing pick and place equipment with some mollification to enable high throughput automation as what currently available on the die placement equipment.

SUMMARY OF THE INVENTION

In this disclosure, a new die placement control methods is invented, which can provide accurate position anchoring during die placement and epoxy molding process. The methods works well with mechanical diced chip, whose dicing errors dominates the position error during FOPLP and FOWLP. Working along with precise dicing method such as plasma dicing, stealth dicing, laser dicing or some combination of them, the total placement error is largely minimized. The method is particularly useful for heterogeneous integration involving chips from different CMOS nodes, even chips from different substrate materials.

The core of the invention is to define the targeted locations of the incoming chips with a predetermined dimensional tolerance in respect of the size of the chips on top of a substrate, together with at least a metallic spring feature (partially-free-moving as it should also has one position fixed) for each targeted location. The substrate is either a panel or a wafer, which can be either a metal plane, or a glass plane or a Si wafer or a ceramic plane or wafer. The structures of targeted locations of the incoming chips are created by either plating a layer of metallic structures (matching the chip dimensions) over the substrate (in this case, the spring anchor can be formed at the same time), or adding recessed structures (matching the chip dimensions) in a add-on glass plane or wafer, or spin coated, or laminated layer (named as over-layer) over the substrate (in this case, the spring anchor need form separately), or creating recessed structures (matching the chip dimensions) in the substrate (in this case, the spring anchor need form separately). The plated metallic anchor structure can be made by either a spring alloy or a magnetic spring alloy metal. The metal anchor structure is a spring feature, which provides force to fix the incoming chips at the locations without or with only minimized movement after die release at the end of die pick-and-place process till epoxy molding compound (EMC) is fully settled.

In one embodiment, a metallic frame to define the lateral dimensions of the targeted location along with at least a metallic spring feature are formed in the same metallic layer at the same time by plating. Then the substrate or an over-layer (over the substrate) is recessed for a predetermined depth to create a partial or full volumetric space for the incoming chip to be inserted into the space safely before the force of the metallic spring feature locks the chip in the location. In this particular case, it is worthwhile to note that the material under the metallic spring feature has already removed to allow it to move freely. During the creation of the volumetric space, the plated metallic frame can act, at least partially, as light blocking layer (for laser or lithography exposure) or a wet etch or a reactive ion etch (RIE) hard mask during the removal of the substrate or the over-layer. This approach has many advantages. Firstly, metallic spring feature is not easy to break and repeatability is good. Secondly, apart from dicing error, the position control precision is ensured by the accurate dimension control defined by the metallic frame, which is made by lithography and plating processes.

In another embodiment, the metallic spring feature has a taper feature to allow chip to be vertical insert into its targeted location by a die placement tool automatically as the taper feature allows the vertical force partially transfer into lateral force to move the spring anchor out of the way to allow the chip into to the space of its targeted location before the spring force locks the chip into the location.

In another embodiment, an external magnetic field is applied to move the magnetic metallic spring feature during the chip insertion in the pick and place process (i.e. placement process). After releasing of the chip, the magnetic field is removed to release the magnetic metallic spring feature to allow it lock the chip into the place by its elastic force. The magnetic field can be provided either from a magnetic coiled attached on placement tool (patented separately) or an external assistant tool.

The incoming chips for the proposed FOWLP and FOPLP system can be either singularized by mechanical dicing or by more accurate dicing method such as plasma dicing, which is particularly suit for chips made on expensive substrate materials or chips with small size.

The incoming chips themselves can also a chip stack such as a stacked memory chip. Combining with accurate dicing, the proposed method provides excellent positioning accuracy without need implement of conventional lithographic exposure correction, thus significantly brings down the cost and increases the throughput. The proposed approaches are particularly important for the formation of chiplet with high specification of positioning control between the component dies and yet provides a very low cost approach for advanced packaging. The method is both good for die face down and face up packaging cases.

Combined with plasma dicing for incoming chips, the proposed methods can drastically reduce the gap between the component chips in a chiplet design, which is particularly important for RF or high speed/high bandwidth chiplet applications.

If the metallic frame, defining the lateral dimensions for the targeted location of the chip and the metallic spring feature are formed in the same metallic layer at the same time, the proposed methods involves only one layer by lithography and plating, which is acceptable in terms of cost, as it is cheaper compared to method involving Si interposer or adding bridging chip as demonstrated by Intel's EMIB approach. Moreover, the built-in metallic structures can be used as EMC lapping stopper and can be used as a metal cap for heat dissipation and/or electromagnetic shield. As such, this embodiment will be used mainly in the following context to illustrate the concept of the current invention although the modification can be made based on the core concept of the invention.

As used herein, the term "or" may be construed in either an inclusive or exclusive sense. Similarly, the term "exemplary" is construed merely to mean an example of something or an exemplar and not necessarily a preferred or ideal means of accomplishing a goal. Additionally, although various exemplary embodiments discussed below focus on quality control of professionals, the embodiments are given merely for clarity and disclosure. Alternative embodiment may employ other systems and methods and are considered as being within the scope of the present invention.

BRIEF DESCRIPTION OF THE DRAWINGS

FIG. 1(a) an embodiment of a projection view of the proposed metallic frame structure with metallic spring/anchor features on top of the panel for incoming chip location fixing without a die inside.

FIG. 1(b) an embodiment of a cross section view of the proposed metal structure with metallic spring/anchor features on top of a recessed template for incoming chip.

FIG. 1(c) an embodiment of a projection view of the proposed metal frame structure with spring/anchor feature on top of the panel for incoming chip location fixing with a die inside.

FIG. 1(d) an embodiment of a cross section view of the proposed metal structure with spring/anchor features on top of a recessed template.

FIG. 2(a) an embodiment of the dilemma or challenge to insert die automatically with the commercially available pick-and place-tool on a spring feature without a taper.

FIG. 2(b) an embodiment of locally zoom in the chip and the spring feature in FIG. 2(a).

FIG. 2(c) an embodiment of using manually insertion method to push the spring feature laterally to get the chip into its location.

FIG. 3(a) an embodiment of implement of external magnetic field to move spring made of magnetic material out of the way when a chip on a pick-and-place tool is above its designated location.

FIG. 3(b) an embodiment of the spring made of magnetic material move out of way and the placement tool move the die into the its reserved area or location.

FIG. 3(c) an embodiment of the spring made of magnetic material locks the die into it location when the external magnetic field is withdrawn.

FIG. 5(a) another embodiment of a incoming die onto a location with a tapered spring feature.

FIG. 5(b) an embodiment of a moving down die on pick-and-place tool with a down force, which partially transfer into a lateral force to move the taped spring out of it way to enable automatically pick-and-place on a standard placement tool.

DETAILED DESCRIPTION

Figures 4A, 4B:
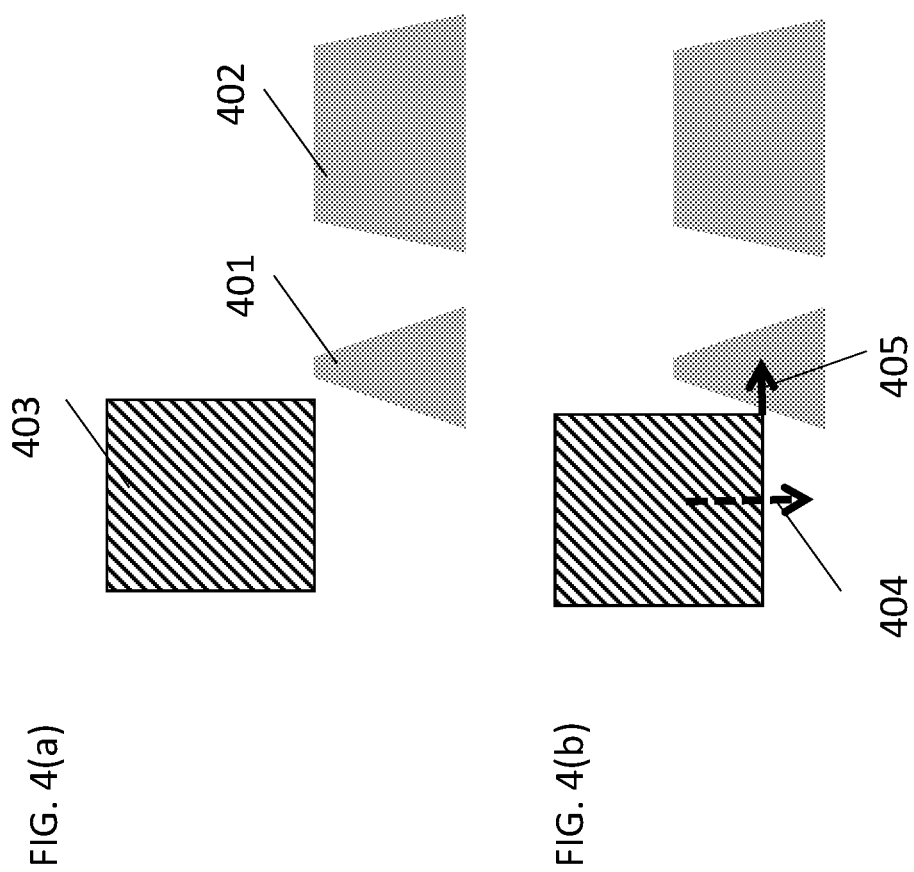
FIG. 4(a) an embodiment of a incoming die at a location with a tapered spring feature.
FIG. 4(b) an embodiment of a moving down die on pick-and-place tool with a down force, which partially transfer into a lateral force to move the taped spring out of it way to enable automatically pick-and-place on a standard placement tool.

The following numerous specific detail descriptions are set forth to provide a thorough understanding of various embodiments of the present disclosure. It will be apparent to one skilled in the art, however, that these specific details need not be employed to practice various embodiments of the present disclosure. In other instances, well known components or methods have not been described.

FIG. 1(a) shows a a projection view of the proposed frame structure with metallic spring/anchor feature on top of a panel or a wafer for an incoming chip location fixing without a die inside. Here, only one structure for a single chip is shown to illustrate the idea of the invention. In this figure, the structure 100. which is on top of a wafer or a panel for FOWLP or FOPLP respectively, is a frame with metal spring feature as a chip anchor. As mentioned previously, the frame can be made of either metallic or dielectric materials. In this particular case, the frame is made of the same material as the metal spring. In another embodiment, frame, on which there is a metal spring structure, can be just the boundaries of a recessed dielectric space reserved for the incoming chip. As shown in FIG. 1(a), the structure 100 has a frame 101, whose edges help to partially define the location of a incoming chip/die; some spring anchor feature 102, whose function is to push and lock the chip/die into its designated location. The dotline 103 represents the designated location of the incoming chip/die. The wafer or the panel below the frame 100 can have optional recessed to allow the chip sit in and reduce the thickness requirement of the frame structure 100. In the case of the surface of the wafer or panel being recessed, the material below the spring anchor 102 needs to be removed as well. There are many methods can be used to remove the material below spring anchor 102. For example pre-treatment of the material below spring anchor 102 such as laser exposure, or light exposure or doping can enhance the etching removal speed. Adding dummy openings 104 as shown here in oval shape can also enhance the removal rate. Obviously, the shape of the dummy opening on spring anchor 102 can vary for the best of mechanical and etch enhancement. The frame 100 can be defined by combination of lithography and plating processes or alternatively processes as long as the all needed features can be created at low cost.

FIG. 1(b) shows a cross section view of A-A' line cut of FIG. 1(a). In this figure, the recessed panel or wafer (or over-layer) case is presented. It is worthwhile to note that the recessed template is an optional choice so is the tape tape (or a temporary bonding layer) at the bottom without a die inside. The frame 101 and the spring anchor feature 102 is over a recessed panel or wafer 106 (for example a glass panel or wafer—they both can be a over-layer bonded over a substrate by temporary bonding layer. It can also be a coated or laminated dielectric layer). The panel or wafer 106 is temporarily bonded using a bonding tape 105 (or a bonding layer) for example on top of a carrier (substrate) 106. In this particular case, the panel or wafer 106 is fully etched through, although partially recessed or etched panel or wafer can be used as well, which does not need to be bonded on top of the carrier(substrate) 106 as itself can be acting as carrier (substrate). If the recessed panel and wafer itself acts also as carrier (substrate), depending on the incoming die is face up or face down, there is different requirements in terms of flatness and thickness control of the recessed plane. Also extra processes needed to remove the un-etched bottom half of the wafer/panel when facing down die scheme is used. In the case shown here, there is no concerns on the bottom flatness and thickness control, which very much suits the die face down case although add bonding tape 106 (or bonding layer) can increase some cost. On the other hand, this approach allows the carrier (or substrate) 106 to be re-used. What is shown here is the simplest situation in terms of control and cost for the subsequent processes, which will be shown later in FIG. 9 when multiple dies/chips are involved and when the RDL is needed. Nevertheless, there are alliterative approaches to compensate the thickness and flatness variation in the subsequent RDL processes to provide wider specifications for thickness and flatness, which is well known for people with ordinary skills in the field.

FIG. 1(c) and FIG. 1(b) shows the projection view and it corresponding cross section view along B-B' cut for FIG. 1(c) with a die 108 inside. The spring force 109 provided by the anchor 102 acting on the die 108 (indicated by the arrow) along with the edges of the frame 101 defines the final location of the die. In this case, the designated location of die 108 is defined by the low-right corn of the frame 101 in respect to the corner of the die 108. Therefore, how well the frame edge is defined together with how well the corner of die 108 being defined during dicing process ultimately decides the accuracy of the final location of die 108 in respect to its designated or nominal location. The bonding strength or its sticky strength can be easily tuned based on the properties and specification of the tape 106, for example rising either ambient temperature or local temperature during die 108 placement process or after all dies are in place then put the whole reconstituted panel of wafer with dies all on it into the oven with predetermined temperature to weaken the bonding tape 105 strength on the top side of the tape. In other case, the top side glue of the tape can be removed by solvent after the panel or wafer is removed. There are well established methods available for the people with ordinary skill in the field.

If needed, the metal structure can be coated with diffusion prohibition layer such as Ti, TiN or TiW then an insulation layer, which is a much easy approach (not drawing here due to difficulties of presenting thin layer). The insulation layer can be dielectric layer or even thin organic layer by dip coating or evaporation. Alternatively, the dielectric coating can be done on incoming die or chip, which is a unusual approach and more expensive.

FIG. 2(a) illustrates the dilemma or challenge to insert die automatically with the commercially available pick-and-place-tool on a spring feature without a taper. Structure 200 is similar to what is shown in FIG. 1(b) a cross section with all the necessary component features indicated just as in FIG. 1(b), a die or die stack 201 on a pick-and-place head (not shown here) moves downwards and try to get into its reserved (or designated, or nominal) place. However, its movement is stopped by the spring feature 202 in its path, a zoom-in representation of the dotline circle 203 indicated areas, is given in FIG. 2(b). As shown in FIG. 2(c), manually placement have to be carried out to push the spring 202 laterally first with the force applied as indicated by arrow 204 then move down along arrow 205 while against the elastic force from the spring 202. The manual insertion lacks of efficiency and throughput therefore is deemed as an impractical approach.

FIG. 3(a) shows one of the solutions proposed in this disclosure, i.e an implement of external magnetic field to move spring made of magnetic material out of the way when a chip on a pick-and-place tool is above its designated location. Similar to FIG. 2(a) and its zoomed-in figure FIG. 2(b), an incoming die 301 approaches to the frame 302, which has a spring feature at its initial position of 303 (represented here by darker gray object with solid-line boundaries) before the external magnetic field 304 is turned on. Once the external field 304 indicated here by arrow is turned on or available depending on whether it is from a electromagnet or a permanent magnet, the spring feature made of magnetic alloy (for example, spring alloy of CoNi or FeNiCu or CuNi etc.) moves to the right to its new location 305 (indicated here by lighter gray object with dashline boundaries) which clears the path for chip to move down into the space 306 as indicated in FIG. 3(b). As shown in FIG. 3(c), once the external magnetic field is withdrawn, under the influence of the elastic force, the spring feature will (have a tendency to move back but stop by the chip) move into its new position 306 and provides a lateral force indicated by the arrow 307 to push the die to left into its designated location defined by the frame edge of the structure as shown in FIG. 1(c). The external magnetic field can be provided locally with either a set of electromagnetic coil (or a hard magnet) attached on the pick-and-place tool or globally from an set of electromagnetic coils, which generates magnetic field in the whole concerned areas FIGS. 4(a) and (b) shows an embodiment of using tapered spring feature to allow pick-and-place tool automatically insert the die into its reserved location. FIG. 4(a) shows a incoming die 403 on a pick-and-place tool (not shown here) over the structure with a metallic spring feature 401 and frame 402. FIG. 4(b) shows when the pick-and-place tool move downwards indicated by arrow 404, the die 403 contacts with the spring 401 and provides a lateral force 405 to push the spring 401 out of its way to open a clear path to allow the die move into it place. Once 403 finishes it vertical movement, it also lock it into its designated position defined by the edges of the frame.

FIGS. 5(a) and (b) shows another embodiment of using different shaped tapered spring feature to allow pick-and-place tool automatically insert the die into its reserved location. FIG. 5(a) shows a incoming die 503 on a pick-and-place tool (not shown here) over the structure with a metallic spring feature 501 and frame 502. FIG. 5(b) shows when the pick-and-place tool move downwards indicated by arrow 504, the die contacts with the spring 501 and provides a lateral force 505 to push the spring 501 out of its way to allow a clear path to allow the die move into it place. Once 503 finishes it vertical movement, it also locks it not its designated position defined by the edges of the frame.

Figure 6B:
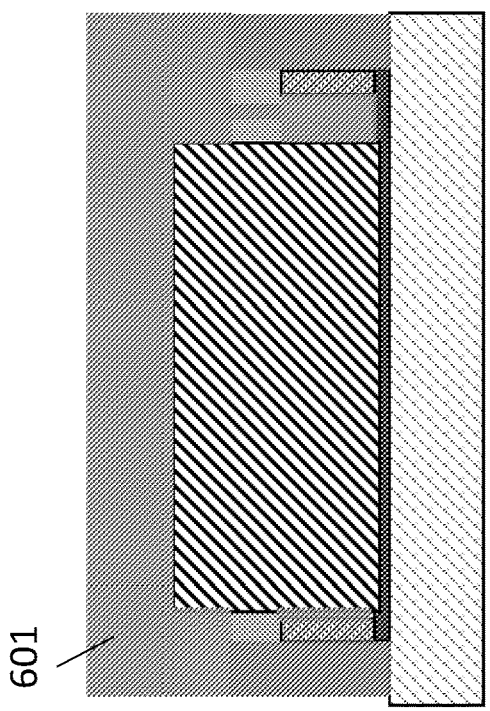
FIG. 6(b) an embodiment of the cross section of a chip in it designated location covered by EMC cut along the A-A' line in FIG. 6(a).
Figure 6A:
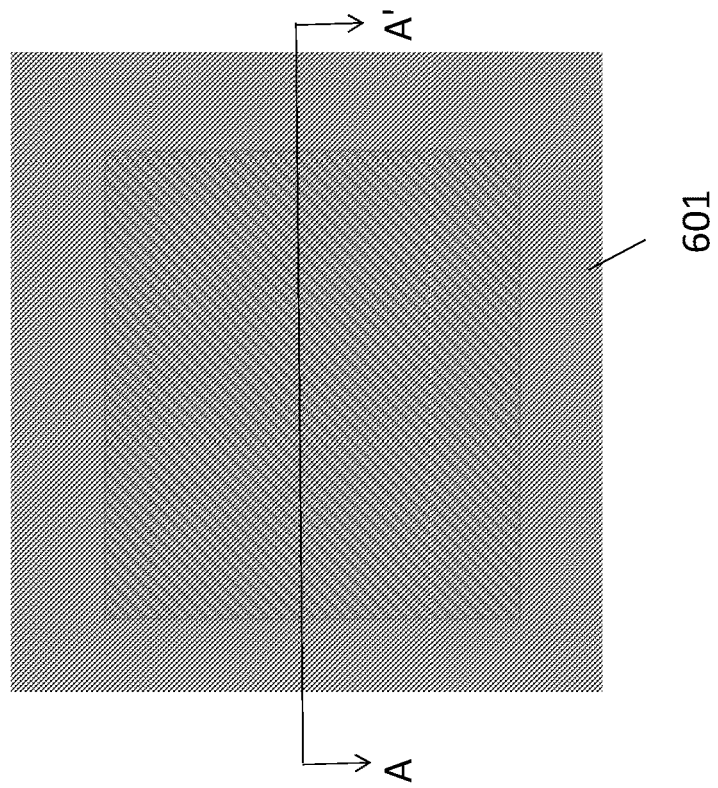
FIG. 6(a) an embodiment of a chip in it designated location covered by EMC.

FIGS. 6(a) and (b) shows what looks like after the EMC is settled. After the die placement done and the dies are locked at its designated position, a EMC is applied as normal using a standard procedure. FIG. 6(a) shows the EMC 601 covered cross the panel or wafer with the die and structure all buried below. FIG. 6(b) shows the cross section view of FIG. 6(a) along A-A' line. It is worthwhile to note that the whole wafer is now buried beneath EMC 601. After EMC settle, the positions of dies is all settled. It is worth to know that some specially designed structures (such as tooth structure) on the frame are needed to allow the EMC easily filling all the gaps between the frame and chip to ensure proper EMC filling.

Figure 7B:
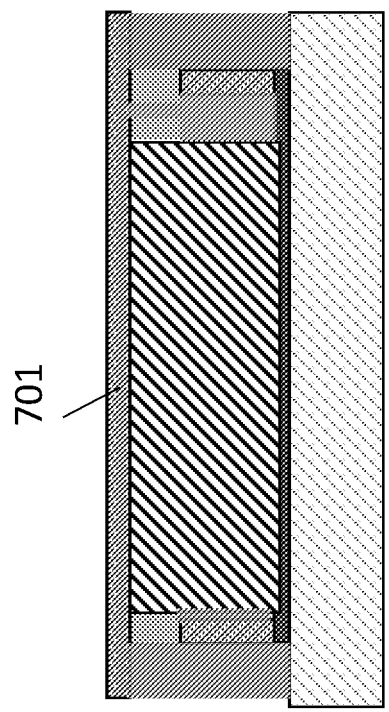
FIG. 7(a) projection view and (b) cross section view along A-A' cut in FIG. 7(a) an embodiment of the structure shown in FIG. 6 with chip back grinding and/or lapping then Chemical mechanical polished (CMP-ed) followed by putting on metal cap for heat dissipation or/and acting as an electromagnetic shield.
Figure 7A:
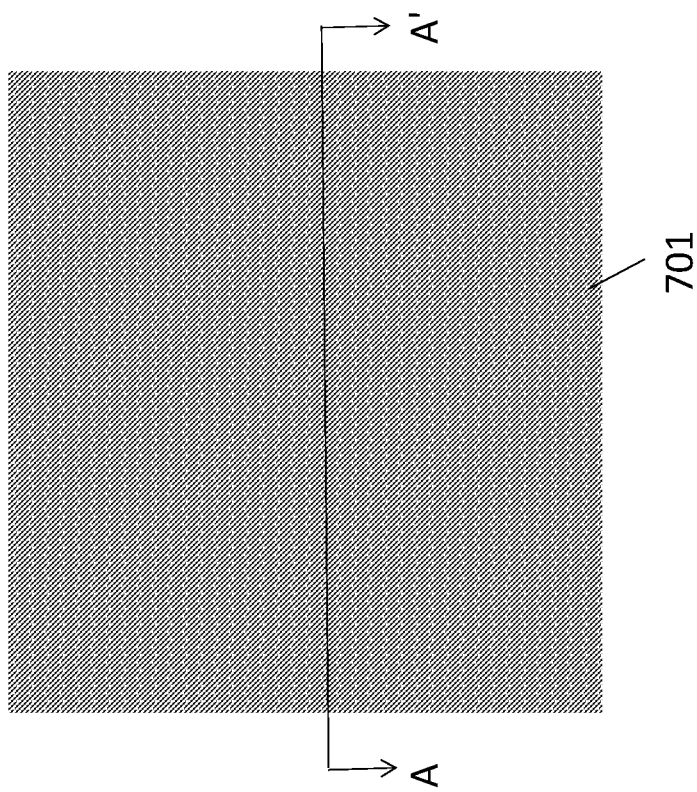

After the EMC fully settled, the EMC is lapped and CMP-ed (if needed), before a metal layer or metal stack layers is deposited or plated on. As shown in FIG. 7(a), there should be metal stack 701 comprising metal adhesion and diffusion stop layer and thicker metal films (the stack structure are not drawn here as it is well known for people with ordinary skills in the field), which can act as either heat dissipation or electromagnetic shield for the chip(s). The cross section along line A-A' is also shown in FIG. 7(b). In fact, with good design and planning, other functions part can be built along with the metallic frame, for example antenna, RF coil, heaters etc, which can further reduce the overall packaging cost.

Figure 8B:
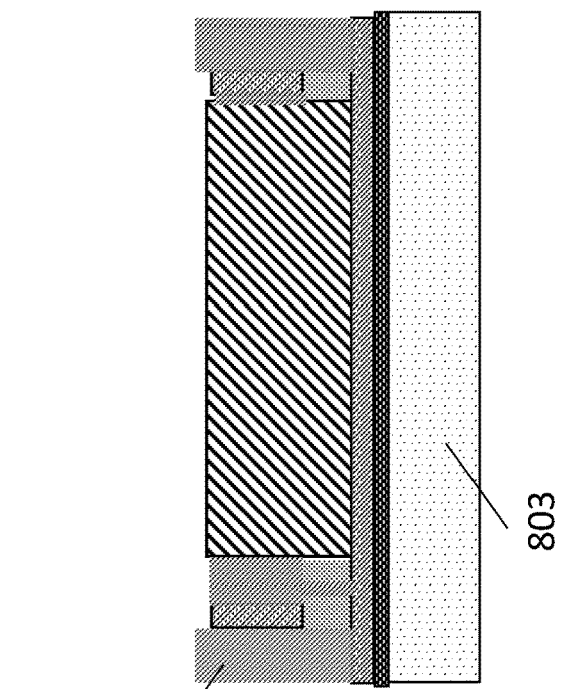
FIG. 8(b) an embodiment of the detouched die in FIG. 8(a) rebond on a carrier substrate either a wafer or a panel to do subsequent processes such as standard redistribution layer (RDL) build and solder bump processes.
Figure 8A:
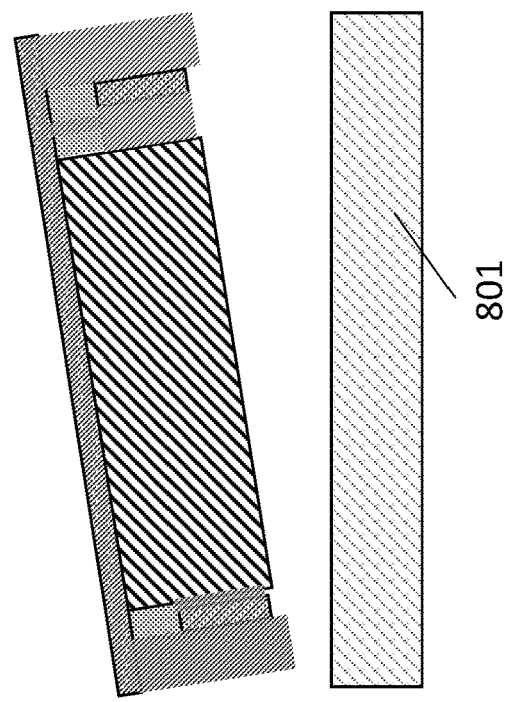
FIG. 8(a) an embodiment of a die in its designated location to detouch from its temporary substrate.

FIG. 8(a) shown the detouchment from its (temporary) substrate 801 (wafer or panel) of a die in its designated location secured by the proposed method after its ECM is fully settled 802. The die with its frame 802 is then bonded again on a carrier wafer or panel 803 for subsequent processes such as standard redistribution layer (RDL) build and solder bump processes as shown in FIG. 8(b). The conventional RDL and solder bumping processes can be used.

Figure 9:
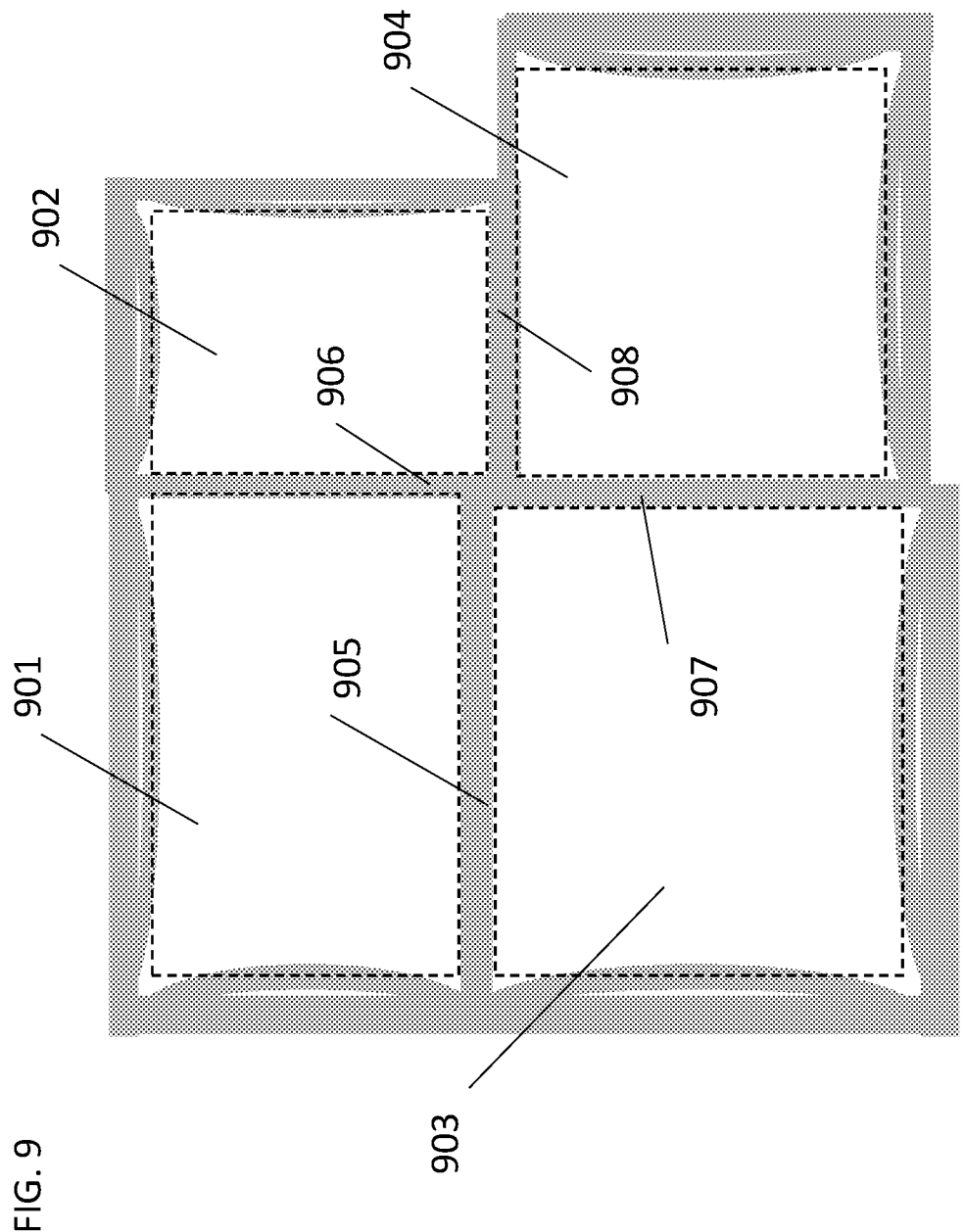
FIG. 9 an embodiment of a chiplet having four component chips via the invitation proposed here with the thin gap between them and metallic spring features to anchor their locations into their designated position before EMC is fully settled. Similar processes as FIG. 8 can then be implemented to electrically connect the component chip with low cost.

FIG. 9 shows a chiplet made of four component chips, 901, 902, 903, 904, whose boundaries represents here by dotline, using the invitation proposed here with the thin gap between them and metallic spring features to anchor their locations into their designated position before EMC is fully settled. It is worthwhile to note that the frames for the chips—901, 902, 903, 904—shares some boundaries, 905, 906, 907, 908, between them so that the distance between the chips can be further reduced when the electrical connections is established by RDL processes. Similar process steps as FIG. 6(a)/(b), FIG. 7(a)/(b) and FIG. 8(a)/(b) can then be implemented to electrically connect the component chip with low cost. As shown, the size of the frames with spring anchors are different to match the sizes of the incoming component chips. Such an approach can further expanding for system with more component chips. Of course, optimization for the arrangement of the component chips is needed as the distance between component chips can not be always the shortest when the frame edge with spring anchor locates between two component chips. The optimization must be carried out to make sure the electrical connection distance between two component chips is kept the shortest or as minimal as possible when the distance impacts the system performance. For those chips, they should be arranged adjacently separated by frame without spring anchor feature. The proposed method provides a low cost and fast throughput approach without the need for the large capital spending on equipment and software links between the metrology tool and lithography exposure tools, which can only do field-to-field sequential correction.

As shown above, in every embodiment shown so far, the frame and/or the spring feature is made by wafer process on top of a panel or a wafer individually. The frame and/or is not reusable. However, for a packaging solution without particularly high location requirements, there are alternative approach for extra low cost purpose. One such an embodiment for example is to use a reusable specially made (for packaging for a particular chip or chiplet) template, with a set of metal frames and its correspondent metal spring features, bonded on a substrate or over-layer (over a substrate or a carrier). The template can be used as a mask or hardmask for exposure or etch the over-layer or substrate to create recess feature for the incoming chips. Using the previously mentioned methodologies, the chips can be insert and locked into their designated locations with EMC implementation. After the EMC is fully settled followed by thin down, the template can be debonded and reused later. Since there are quite some process details needed for each steps involved, a separated disclosure will be filed subsequently.

What is claimed is:

1. An chip packaging system comprises at least:
    a partially-free-moving metallic spring feature, which provides a force on an incoming chip to push the chip moving into a designated position for the chip then provides an anchor force to the chip during a epoxy molding compound (EMC) implementation process before the EMC is fully settled;
    a metallic frame, some of whose edge(s) defines a set of lateral boundaries for the designated position;
    a substrate either a panel or a wafer, on which the metal frame and the partially-free-moving metallic spring feature is built on;
    the partially-free-moving metallic spring feature has a tapered cross section, which allows said incoming chip push said partially-free-moving metallic spring feature out of its way when the chip move down vertically on a pick-and-place tool.

2. The system of claim 1, wherein said metallic frame and said partially-free-moving metallic spring feature are coated with an diffusion stop layer then an insulating layer to avoid metal diffusion and unwanted electrical connection between the chip and, the metallic frame and the metallic spring feature.

3. The system of claim 1, wherein said substrate is partially etched away to provide a vertically recessed space for the incoming chip.

4. The system of claim 1, wherein said substrate has a over-layer, which is etched through its full thickness under said partially-free-moving metallic spring feature and within said set of boundaries to provide a space for the chip.

5. The system of the claim 1, wherein said epoxy molding compound (EMC), after fully settled, is thinned down to a predetermined thickness before a metal overcoat is deposited over it.

6. The system of the claim 5, wherein said metal overcoat together with the metallic frame forms an electromagnetic shield for the chip.

7. The system of the claim 5, wherein said metal overcoat together with the metallic frame forms a heat sink and/or a heat dissipation path.

8. The system of the claim 1, wherein said chip packaging system is used to establish an electron connection between a group of component chips, each of which has its own dedicated metallic frame and partially-free-moving metallic spring feature.

9. The system of the claim 8, wherein said electron connection has a set of solder bumps over it to meet a design requirement for a fan-out wafer level packaging (FOWLP) or a fan-out panel level packaging (FOPLP).

10. The system of claim 4, wherein said over-layer is a kind of glass, which is treated at a set of predetermined position(s), being able be etched later, by either a laser exposure or a ion doping before the metallic spring feature and the metallic frame are built.

11. The system of claim 4, wherein said over-layer is a spin-coated dielectric layer, which is removable by either cutting, or development, or wet etch, or reactive ion etching.

12. The system of claim 4, wherein said over-layer is a laminated dielectric layer, which is removable by either cutting, or development, or wet etch, or reactive ion etching.

* * * * *